United States Patent
Miyazaki

(10) Patent No.: US 7,006,385 B2
(45) Date of Patent: Feb. 28, 2006

(54) SEMICONDUCTOR STORAGE DEVICE

(75) Inventor: Hirokazu Miyazaki, Minato-ku (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 43 days.

(21) Appl. No.: 10/859,187

(22) Filed: Jun. 3, 2004

(65) Prior Publication Data
US 2004/0246759 A1    Dec. 9, 2004

(30) Foreign Application Priority Data
Jun. 6, 2003  (JP) ............................ 2003-161707

(51) Int. Cl.
*G11C 16/04*  (2006.01)
(52) U.S. Cl. ........................ 365/185.29; 365/185.25
(58) Field of Classification Search .......... 365/185.29, 365/185.01, 185.11, 189.18, 185.25, 204
See application file for complete search history.

(56) References Cited

U.S. PATENT DOCUMENTS 6,747,902 B1 * 6/2004 Seki et al. ............. 365/185.29
6,909,639 B1 * 6/2005 Park et al. ............. 365/185.25

FOREIGN PATENT DOCUMENTS

JP          2000-100183          4/2000

* cited by examiner

*Primary Examiner*—Gene N. Auduong
(74) *Attorney, Agent, or Firm*—Nixon Peabody LLP; Donald R. Studebaker

(57) ABSTRACT

A nonvolatile memory device includes a memory cell array, a control circuit, a voltage boost circuit, a timer circuit, a discharge circuit and a sensor circuit. The control circuit generates an erase execution (EE) signal in response to an erase command (EC) signal, stops the EE signal and generates a discharge control (DC) signal in response to an erase termination (ET) signal, stops the DC signal in response to a discharge termination (DT) signal, and stops the EE signal and the DC signal in response to a reset signal. The boost circuit provides high voltage in response to the EE signal. The timer circuit generates the ET signal after receiving the EE signal. The discharge circuit discharges the high voltage and the sensor is enabled in response to the DC signal or the reset signal. The sensor generates the DT signal when the high voltage drops to a predetermined voltage.

18 Claims, 6 Drawing Sheets

SEMICONDUCTOR STORAGE DEVICE

BACKGROUND OF THE INVENTION

The present invention relates to a semiconductor storage device that writes or erases data by applying high voltage to a floating gate. More specifically, the present invention relates to a technology for prevention against damage due to a reset during operations of the device.

The flash memory, one of the nonvolatile memory, is electrically rewritable nonvolatile memory and is also termed EEPROM. The flash memory uses a field effect transistor as a memory cell. The field effect transistor has a floating gate. The flash memory applies high voltage to a selected memory cell. The flash memory stores an electric charge in the floating gate or discharges the stored electric charge to rewrite the stored contents.

The flash memory comprises a memory cell array, a voltage converter, a timer circuit, a discharge circuit, a sensor circuit, a word line decoder, and a control circuit. The memory cell array comprises memory cells that store data and are disposed in a matrix. The voltage converter generates high voltage needed to rewrite the stored contents. The timer circuit determines the timing to terminate the rewriting. The discharge circuit discharges the high voltage after termination of the rewriting. The sensor circuit detects that the high voltage is discharged. The word line decoder selects a word line based on an address signal and outputs high voltage when rewriting data. The control circuit controls overall operations of these circuits.

When the flash memory is in the standby state, i.e., neither reading nor writing is performed, the voltage converter does not operate. The voltage converter outputs a normal power supply voltage. The word line decoder stops operating. A reference potential (ground potential) is output to all word lines.

When an erase command is supplied to the flash memory's control circuit, for example, the control circuit outputs an erase start signal to start an erase operation. The erase start signal is supplied to the voltage converter, the timer circuit, the discharge circuit, and the word line decoder to release the standby state of these circuits. When the voltage converter outputs a boosted voltage (power supply voltage at this time), the word line decoder outputs this voltage to a word line selected based on the address signal.

After a specified lapse of time, the control circuit supplies an erase execution signal to the voltage converter and the timer circuit. This allows the voltage converter to start a boost operation. An output boosted voltage increases up to a specified high voltage (erase voltage) with the lapse of time. In addition, the timer circuit starts time monitoring to determine the timing to terminate the erase operation.

Let us assume that the boosted voltage output from the voltage converter rises up to the erase voltage and another specified time elapses. Then, the word line supplies the erase voltage to erase the stored contents in the memory cell connected to the selected word line.

After the monitoring time of the timer circuit elapses, the timer circuit outputs an erase termination signal to the control circuit. This stops the erase execution signal output from the control circuit. A discharge control signal is output instead. Stopping the erase execution signal stops the boost operation of the voltage converter and the time monitoring of the timer circuit. Since the discharge control signal is output, the discharge circuit starts discharging the electric charge from output wiring of the voltage converter and from the word line decoder. In addition, the sensor circuit starts monitoring the boosted voltage.

After the boosted voltage is discharged and the specified power supply voltage is resumed, the sensor circuit outputs a discharge termination signal to the control circuit. This stops the erase start signal output from the control circuit, placing the voltage converter, the timer circuit, the discharge circuit, and the word line decoder in the standby state.

However, the conventional flash memory is subject to the following problems.

For example, the LSI (large scale integrated circuit) such as a micro-controller integrates not only a CPU (central processing unit), but also memory, an input/output circuit, and the like into a single chip. Specified programs are stored in the memory to perform specified operations. As the memory installed on the micro-controller, the flash memory is used to store programs and permanent data.

The micro-controller may be supplied with a reset signal from the outside. In this case, the micro-controller is configured to reset all the circuits including the CPU irrespectively of operating states at the time of the reset. Accordingly, supplying the reset signal allows the control circuit to immediately stop supplying the erase start signal, the erase execution signal, and the discharge control signal to the flash memory installed on the micro-controller.

If the reset signal is supplied during an erase operation of the flash memory, for example, the standby state immediately takes effect. At this time, the voltage converter is still active. The discharge circuit is inactive. If the high voltage directly changes to the reference potential, there is a possibility of causing dynamic latch-up. The dynamic latch-up condition allows a large current to continuously flow triggered by a current flowing into the reference potential. Further, transistors themselves are subject to the decreased voltage resistance ability because the transistors are miniaturized and the power supply voltage is decreased. When the high voltage directly changes to the reference potential, there has been the problem of damaging a transistor applied with the high voltage.

SUMMARY OF THE INVENTION

A nonvolatile memory device of the present invention includes a memory cell array, a control circuit, a voltage boost circuit, a timer circuit, a discharge circuit and a sensor circuit. The control circuit generates an erase execution (EE) signal in response to an erase command (EC) signal, stops the EE signal and generates a discharge control (DC) signal in response to an erase termination (ET) signal, stops the DC signal in response to a discharge termination (DT) signal, and stops the EE signal and the DC signal in response to a reset signal. The boost circuit provides high voltage in response to the EE signal. The timer circuit generates the ET signal after receiving the EE signal. The discharge circuit discharges the high voltage and the sensor circuit is enabled in response to the DC signal or the reset signal. The sensor circuit generates the DT signal when the high voltage drops to a predetermined voltage.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

First Embodiment

Figure 1:
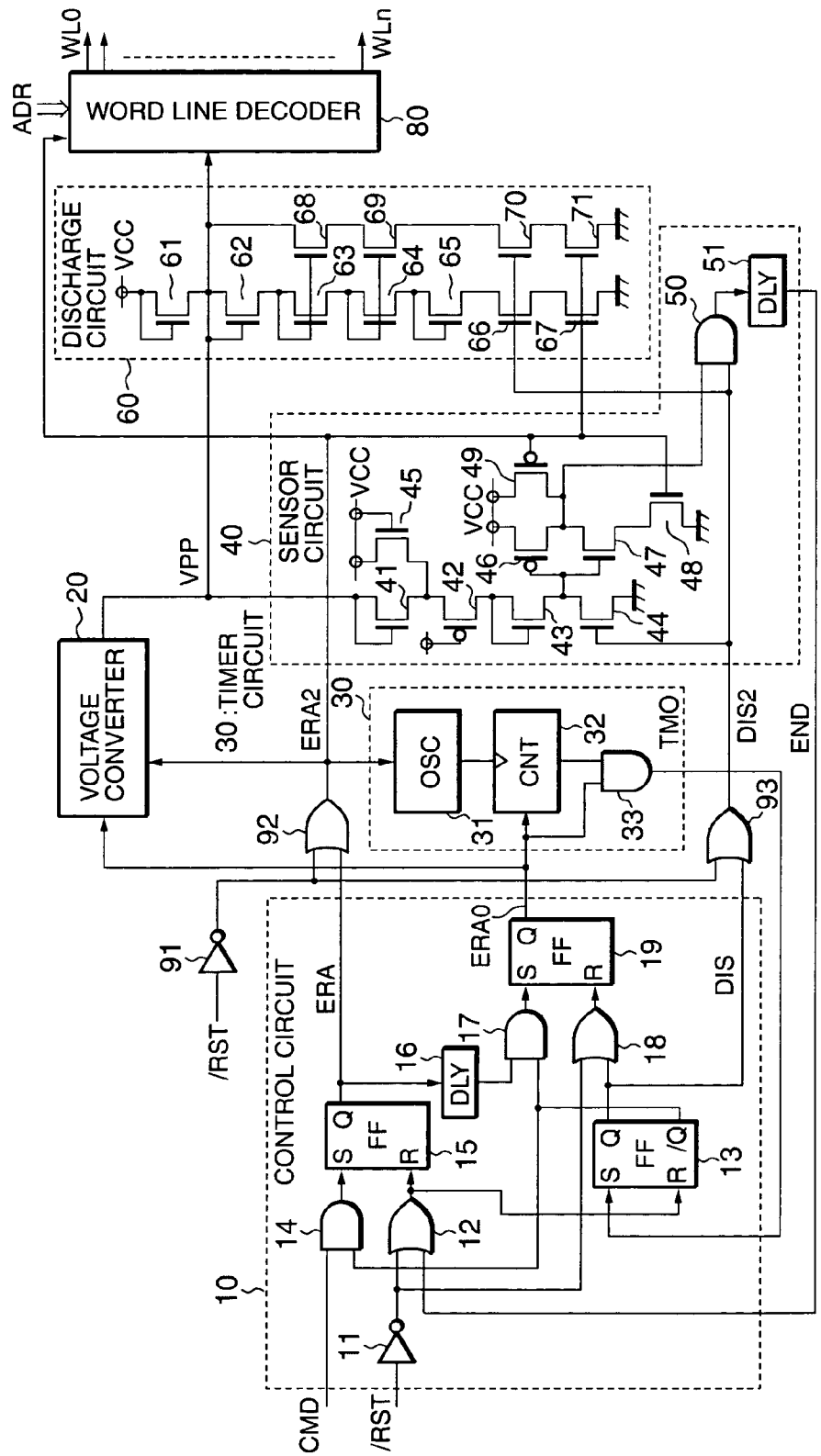
FIG. 1 is a block diagram showing an erase circuit in a flash memory according to a first embodiment of the present invention.

FIG. 1 is a block diagram showing an erase circuit in a flash memory according to a first embodiment of the present invention.

The erase circuit comprises a control circuit 10, a voltage converter (booster) 30, a timer circuit 30, a sensor circuit 40, a discharge circuit 60, and a word line decoder 80 for performing erase operations on a memory cell array (not shown in Figs. as a box, but word lines represent the memory cell array). In addition, the erase circuit comprises an inverter 91 and 2-input ORs (OR gates) 92 and 93 to act against a reset condition during erase operations.

When supplied with an erase command CMD, the control circuit 10 sequentially outputs an erase start signal ERA and an erase execution signal ERA0 at a specified time interval. When supplied with an erase termination signal TMO, the control circuit 10 stops the erase execution signal ERA0 and outputs a discharge control signal DIS. When supplied with a discharge termination signal END, the control circuit 10 stops the erase start signal ERA. Further, when supplied with a reset signal /RST (indicating a reverse logic with /) from the outside, the control circuit 10 stops the erase start signal ERA, the erase execution signal ERA0, and the discharge control signal DIS irrespectively of their states.

The control circuit 10 has an inverter 11 supplied with the reset signal /RST. An output side of the inverter 11 is connected to one of input sides of a 2-input OR 12. The other input side of the OR 12 is supplied with the discharge termination signal END from the sensor circuit 40. An output side of the OR 12 is connected to a reset terminal R of a set/reset type FF (flip-flop) 13. A set terminal S of the FF 13 is supplied with the erase termination signal TMO from the timer circuit 30. An output terminal Q of the FF 13 outputs the discharge control signal DIS.

An inverted output terminal /Q of the FF 13 is connected to one of input sides of a 2-input AND (AND gate). The other input side of the AND 14 is supplied with the erase command CMD. Output sides of the AND 14 and the OR 12 are connected to a set terminal S and a reset terminal R of a set/reset type FF 15, respectively.

An output terminal Q of the FF 15 outputs the erase start signal ERA. The erase start signal ERA is supplied to one of input sides of a 2-input AND 17 via a delay element (DLY) 16. The other input side of the AND 17 connects with the inverted output terminal /Q of the FF 13. The output side of the inverter 11 is further connected to one of input sides of a 2-input OR 18. The output terminal Q of the FF 13 is connected to the other input side of the OR 18.

Output sides of the AND 17 and the OR 18 are connected to a set terminal S and a reset terminal R of a set/reset type FF 19, respectively. An output terminal Q of the FF 19 outputs the erase execution signal ERA0.

The erase start signal ERA and the discharge control signal DIS are each supplied to one of input sides of the OR 92 and 93, respectively. The other input sides of the OR 92 and 93 are supplied with the reset signal /RST inverted by the inverter 91. The ORs 92 and 93 output the erase start signal ERA2 and the discharge control signal DIS2, respectively.

That is to say, the OR 92 sets the erase start signal ERA2 to "H" when the erase start signal ERA maintains level "H" or the reset signal /RST maintains level "L". The OR 92 then supplies that erase start signal ERA2 to the voltage converter 20, the timer circuit 30, the sensor circuit 40, the discharge circuit 60, and the word line decoder 80. The OR 93 sets the discharge control signal DIS2 to "H" when the discharge control signal DIS maintains level "H" or the reset signal /RST maintains level "L". The OR 93 then supplies that discharge control signal DIS2 to the sensor circuit 40 and the discharge circuit 60.

The voltage converter 20 comprises a charge pump, for example. The voltage converter 20 outputs boosted voltage VPP needed for rewriting the stored contents in accordance with the erase execution signal ERA0 supplied from the control circuit 10. An output side of the voltage converter 20 connects with the sensor circuit 40, the discharge circuit 60, and the word line decoder 80.

The timer circuit 30 starts time monitoring to determine the timing to terminate the erase operation when the erase start signal ERA0 is supplied. When a specified monitoring time elapses, the timer circuit 30 outputs the erase termination signal TMO to the control circuit 10.

For example, the timer circuit 30 comprises an oscillator (OSC) 31, a counter (CNT) 32, and an AND 33. The oscillator 31 is activated by the erase start signal ERA2. The counter 32 counts a clock signal output from the oscillator 31 when the erase execution signal ERA0 is supplied. The AND 33 performs logical multiplication between the erase execution signal ERA0 and count-over output from the counter 32 and outputs a result as the erase termination signal TMO.

When the erase operation terminates, discharge of the boosted voltage VPP starts in accordance with the discharge control signal DIS2. At this time, the sensor circuit 40 compares the boosted voltage VPP with the power supply voltage VCC. When the boosted voltage VPP is discharged and the power supply voltage VCC is resumed, the sensor circuit 40 outputs the discharge termination signal END to the control circuit 10.

For example, the sensor circuit 40 has an NMOS (N-channel MOS transistor) 41, a PMOS (P-channel MOS transistor) 42, and NMOSs 43 and 44. These transistors are serially connected between an output side of a voltage converter 20 and a ground potential GND. The gate of the NMOS 44 is supplied with the discharge control signal DIS2. An NMOS 45 is connected between the power supply voltage VCC and the source of the NMOS 41. Further, the sensor circuit 40 has a PMOS 46 and NMOSs 47 and 48 serially connected between the power supply voltage VCC and the ground potential GND. The gates of the PMOS 46 and the NMOS 47 are connected to the drain of the NMOS 44.

A PMOS 49 is connected parallel to the PMOS 46. The erase start signal ERA2 is supplied to the gates of the PMOS 49 and the NMOS 48. The drain of the PMOS 49 is connected to one of input sides of A 2-input AND 50. The discharge control signal DIS2 is supplied to the other input side of the AND 50. A delay element 51 is connected to an output side of the AND 50. The delay element 51 outputs the discharge termination signal END.

When the discharge control signal DIS is supplied after termination of rewriting, the discharge circuit 60 discharges electric charges on the output wiring of the voltage converter 20 and in the word line decoder 80. The discharge circuit 60 rapidly drops the boosted voltage VPP down to the power supply voltage VCC.

For example, the discharge circuit 60 has NMOSs 61 through 67. The NMOS 61 is connected between the power supply voltage VCC and the boosted voltage VPP in a diode-connection fashion. The NMOSs 62 through 67 are serially connected between the boosted voltage VPP and the ground potential GND. Further, the discharge circuit 60 has NMOSs 68 through 71 serially connected between the boosted voltage VPP and the ground potential GND. The gates of the NMOSs 63 and 68 are connected to those of the NMOSs 64 and 69, respectively. The gates of the NMOSs 66 and 70 are supplied with the discharge control signal DIS2. The gates of the NMOSs 67 and 71 are supplied with the erase start signal ERA2.

Figure 2:
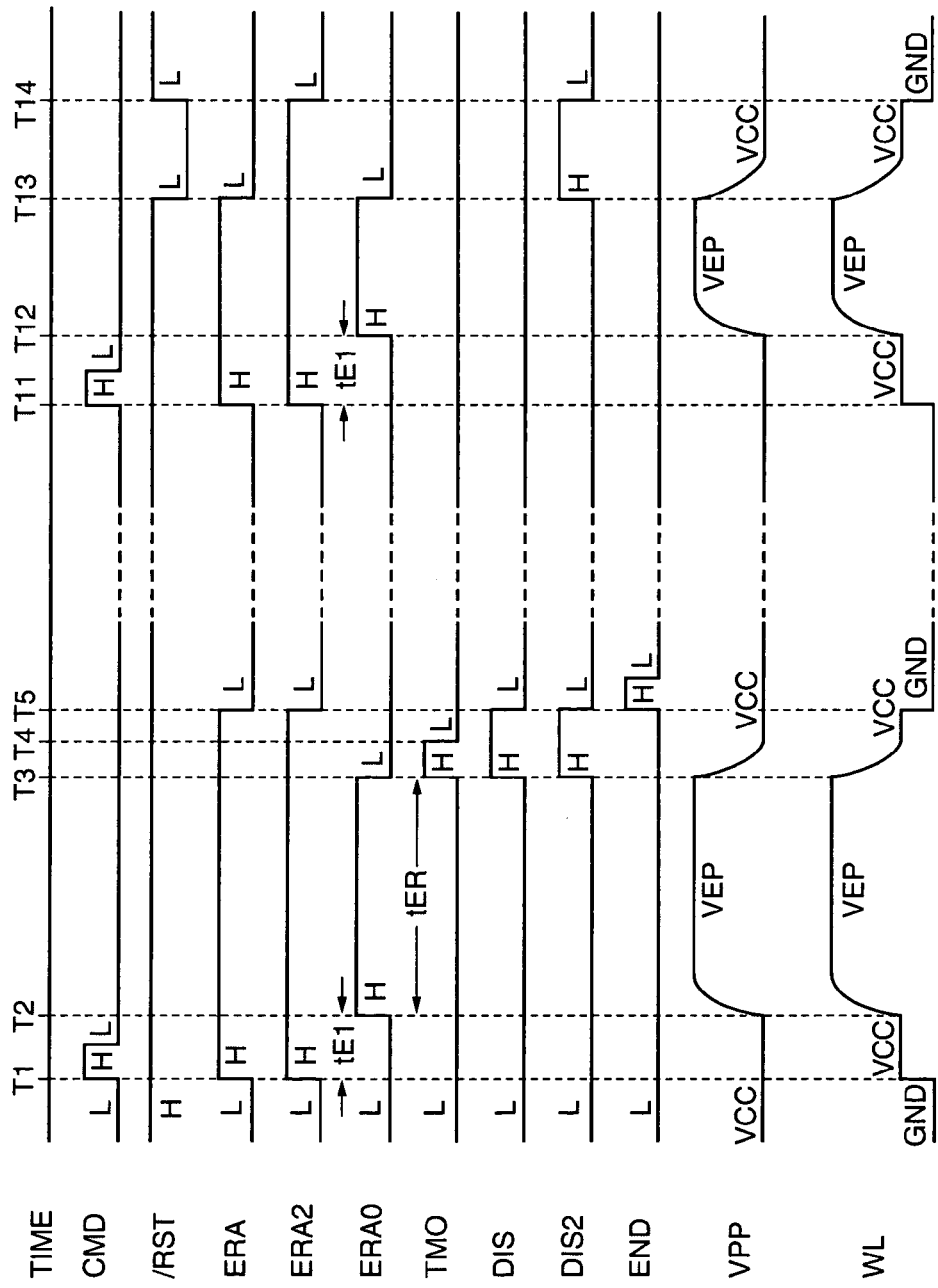
FIG. 2 is a signal waveform diagram showing operations in FIG. 1.

FIG. 2 is a signal waveform diagram showing operations in FIG. 1. With reference to FIG. 2, the following describes operations in FIG. 1 in terms of (1) a normal erase operation and (2) reset during an erase operation.

(1) Normal Erase Operation

During a normal erase operation, the reset signal /RST is always set to "H".

In the standby state, the erase command CMD is reset to "L". The erase start signal ERA, the erase execution signal ERA0, and the discharge control signal DIS output from the control circuit 10 are all reset to "L". Therefore, the erase start signal ERA2 and the discharge control signal DIS2 output from the ORs 92 and 93 are also reset to "L", respectively. As a result, the erase termination signal TMO output from the timer circuit 30 and the discharge termination signal END output from the sensor circuit 40 are reset to "L". All word lines WLs of the word line decoder 80 are set to the ground potential GND. The boosted voltage VPP output from the voltage converter 20 is equivalent to the power supply voltage VCC.

The erase operation starts at time T1 in FIG. 2. When the erase command CMD supplied to the control circuit 10 temporarily goes "H", the erase start signal ERA goes "H" and the erase start signal ERA2 also goes "H". This releases the standby state of each circuit and starts the erase operation. The word line decoder 80 outputs the power supply voltage VCC to a word line WL selected by the address signal ADR.

When a specified period of time tEI elapses from time T1, the erase execution signal ERA0 goes "H" at time T2. This starts the voltage converter 20 to operate. The boosted voltage VPP rises from the power supply voltage VCC to an erase voltage VEP with the lapse of time. Accordingly, the voltage of the selected word line WL rises from the power supply voltage VCC to the erase voltage VEP with the lapse of time. On the other hand, the timer circuit 30 starts the time monitoring.

When monitoring time tER elapses from time T2 under control of the timer circuit 30, the erase termination signal TMO goes "H" at time T3. As a result, the erase execution signal ERA0 goes "L". The discharge control signals DIS and DIS2 go "H". Resetting the erase execution signal ERA0 to "L" stops operating the voltage converter 20. Setting the discharge control signal DIS2 to "H" starts operating the discharge circuit 60. As a result, the boosted voltage VPP output from the voltage converter 20 and the voltage of the selected word line WL drop from the erase voltage VEP down to the power supply voltage VCC with the lapse of time. Resetting the erase execution signal ERA0 to "L" resets the erase termination signal TMO to "L" at time T4.

At time T5, the boosted voltage VPP is discharged to drop down to almost the power supply voltage VCC. At this time, the discharge termination signal END goes "H". As a result, the erase start signal ERA and the discharge control signal DIS go "L". The erase start signal ERA2 and the discharge control signal DIS2 also go "L". The word line decoder 80 allows all the word lines WLs to be set to the ground potential GND.

At time T6, resetting the discharge control signal DIS2 to "L" also resets the discharge termination signal END to "L". As a result, all the circuits including the control circuit 10 return to the standby state.

(2) Reset During an Erase Operation

At time T11, the erase operation starts and the erase command CMD temporarily goes "H". At this time, the erase start signal ERA goes "H" and the erase start signal ERA2 also goes "H". As a result, the standby state of each circuit is released to start the erase operation. The word line decoder 80 outputs the power supply voltage VCC to the word line WL selected by the address signal ADR.

When the specified period of time tEI elapses from time T11, the erase execution signal ERA0 goes "H" at time T12. This starts the voltage converter 20 to operate. The boosted voltage VPP rises from the power supply voltage VCC to an erase voltage VEP with the lapse of time. The voltage of the selected word line WL rises from the power supply voltage VCC to the erase voltage VEP with the lapse of time. On the other hand, the timer circuit 30 starts the time monitoring.

At time T13, the reset signal /RST goes "L" during the erase operation, i.e., before monitoring time tER elapses from time T2 under control of the timer circuit 30. The control circuit 10 is reset to forcibly reset the erase start signal ERA and the erase execution signal ERA0 to "L". As a result, the voltage converter 20 and the timer circuit 30 stop.

On the other hand, the reset signal /RST is inverted in the inverter 91 and is supplied to the ORs 92 and 93. The erase start signal ERA2 and the discharge control signal DIS2 output from the ORs 92 and 93 go "H". This starts operations of the sensor circuit 40 and the discharge circuit 60. The boosted voltage VPP is discharged to drop down to the power supply voltage VCC with the lapse of time.

At time T14, the reset signal /RST is released to return to "H". At this time, the erase start signal ERA2 and the discharge control signal DIS2 go "L". As a result, all the circuits including the control circuit 10 return to the standby state.

As mentioned above, the erase circuit according to the embodiment is configured to forcibly operate the discharge circuit 60 while the reset signal /RST remains "L". Accordingly, it is a good practice to set the pulse width of the reset signal /RST longer than the time needed for discharging. This makes it possible to resume the standby state after completely discharging the boosted voltage VPP even if the reset signal /RST is supplied during the erase operation. It is possible to decrease chances of causing dynamic latch-up or damaging transistors.

Second Embodiment

Figure 3:
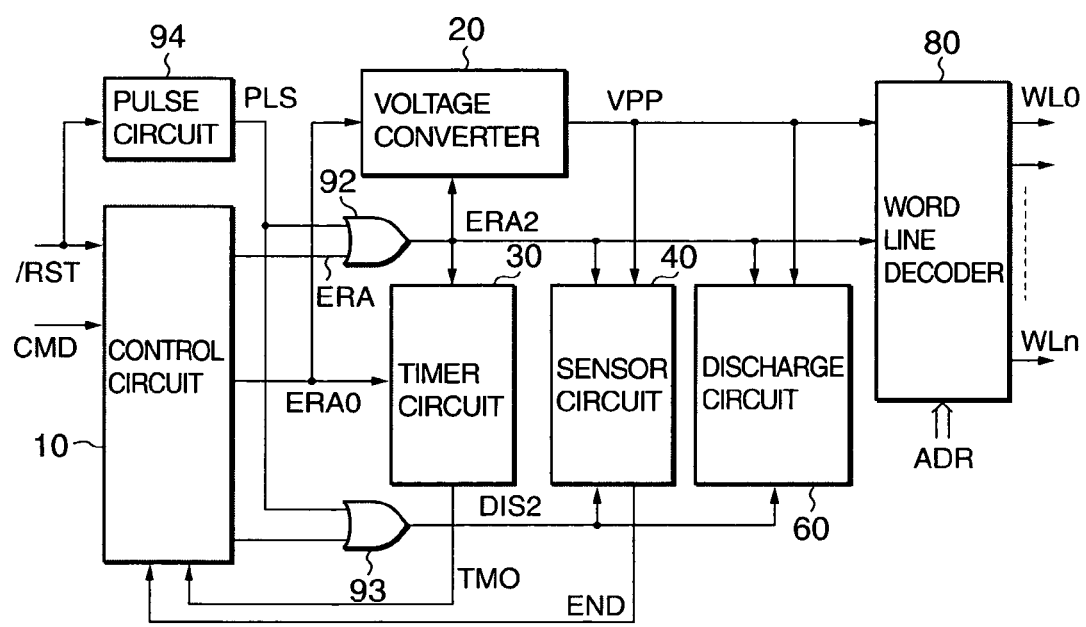
FIG. 3 is a block diagram showing an erase circuit in a flash memory according to a second embodiment of the present invention.

FIG. 3 is a block diagram showing an erase circuit in a flash memory according to a second embodiment of the present invention. The mutually corresponding components in FIGS. 3 and 1 are designated by the same reference numerals and symbols.

This erase circuit is provided with a pulse circuit 94 in place of the inverter 91 in FIG. 1. The pulse circuit 94 comprises a monostable multivibrator, for example. When the reset signal /RST changes from "H" to "L", the pulse circuit 94 outputs a pulse signal PLS that goes "H" for a specified period of time tDPL. Accordingly, the OR 92 outputs the erase start signal ERA2 when the erase start signal ERA or the pulse signal PLS is supplied. The OR 93 outputs the discharge control signal DIS2 when the discharge control signal DIS or the pulse signal PLS is supplied. The other configurations are the same as those in FIG. 1.

Figure 4:
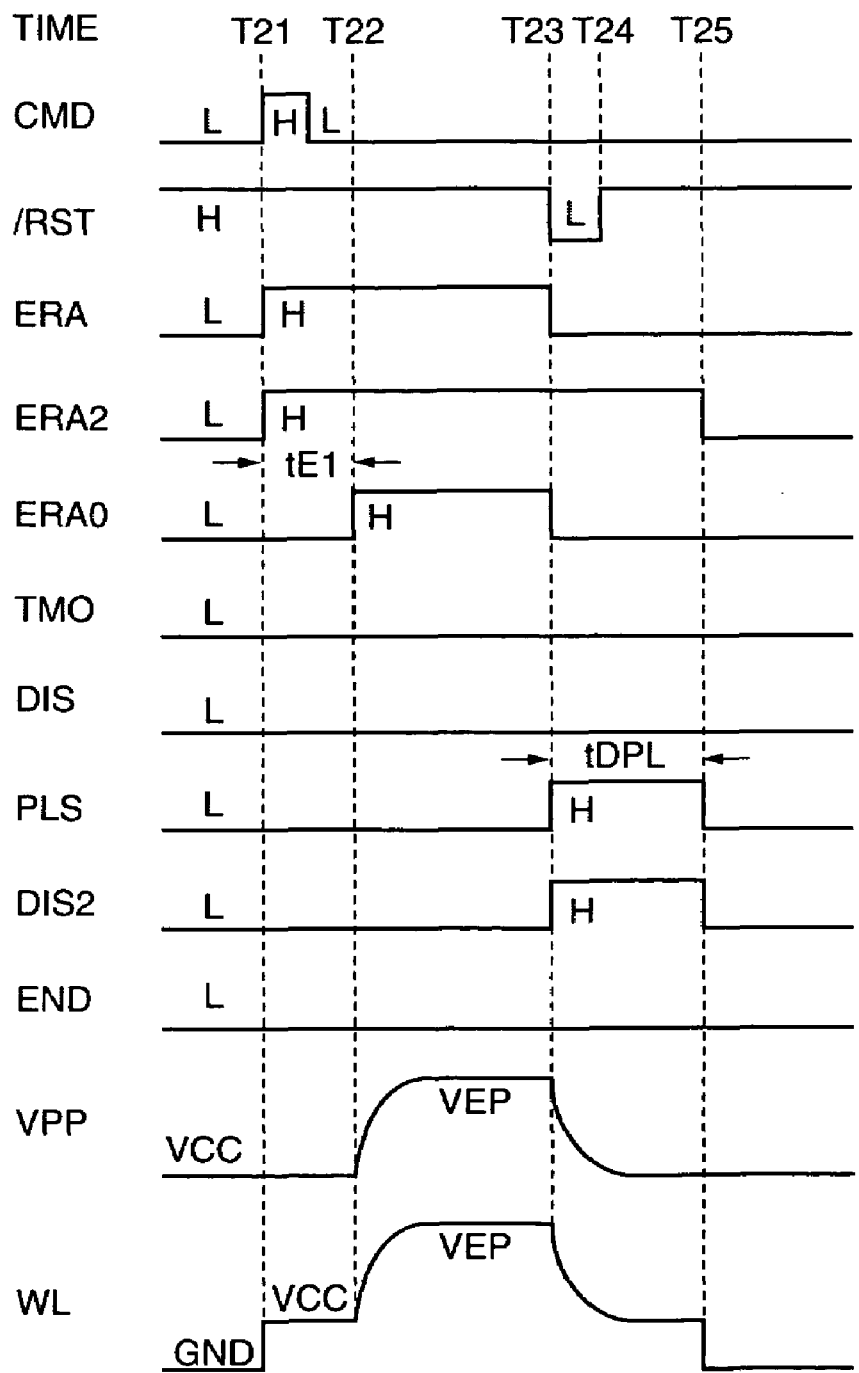
FIG. 4 is a signal waveform diagram showing operations in FIG. 3.

FIG. 4 is a signal waveform diagram showing a reset operation during the erase operation in FIG. 3. With reference to FIG. 4, the following describes operations when the reset is activated during the erase operation of the erase circuit in FIG. 3. Since the normal erase operation is the same as for the first embodiment, the description is omitted.

In the standby state, the reset signal /RST and the erase command CMD remain "H" and "L", respectively. The erase start signal ERA, the erase execution signal ERA0, and the discharge control signal DIS output from the control circuit 10 are all reset to "L". Accordingly, the erase start signal ERA2 and the discharge control signal DIS2 respectively output from the ORs 92 and 93 also remain "L". As a result, the erase termination signal TMO output from the timer circuit 30 and the discharge termination signal END output from the sensor circuit 40 are reset to "L". All word lines WLs of the word line decoder 80 are set to the ground potential GND. The boosted voltage VPP output from the voltage converter 20 is equivalent to the power supply voltage VCC.

When the erase command CMD temporarily goes "H" at time T21, the erase start signal ERA goes "H" and the erase start signal ERA2 also goes "H". This releases the standby state of each circuit and starts the erase operation. The word line decoder 80 outputs the power supply voltage VCC to a word line WL selected by the address signal ADR.

When a specified period of time tEI elapses from time T21, the erase execution signal ERA0 goes "H" at time T22. This starts the voltage converter 20 to operate. The boosted voltage VPP rises from the power supply voltage VCC to an erase voltage VEP with the lapse of time. Accordingly, the voltage of the selected word line WL rises from the power supply voltage VCC to the erase voltage VEP with the lapse of time. On the other hand, the timer circuit 30 starts the time monitoring.

At time T23, the reset signal /RST is reset to "L" during the erase operation. At this time, the control circuit 10 is reset to forcibly reset the erase start signal ERA and the erase execution signal ERA0. As a result, the voltage converter 20 and the timer circuit 30 stop.

On the other hand, when the reset signal /RST changes from "H" to "L", the pulse circuit 94 outputs a pulse signal PLS that goes "H" for a specified period of time tDPL. The pulse signal PLS is continuously output irrespectively of subsequent states of the reset signal /RST, e.g., even if the reset signal /RST goes "H" at time T24 immediately after that.

The pulse signal PLS is supplied to the ORs 92 and 93. Accordingly, the erase start signal ERA2 and the discharge control signal DIS2 output from the ORs 92 and 93 also go "H" for the specified period of time tDPL. As a result, the discharge circuit 60 starts. The boosted voltage VPP drops down to the power supply voltage VCC with the lapse of time.

When the pulse signal PLS returns to "L" at time T25, the erase start signal ERA2 and the discharge control signal DIS2 also go "L". As a result, all the circuits including the control circuit 10 return to the standby state.

As mentioned above, the erase circuit according to the second embodiment uses the pulse circuit 94. The pulse circuit 94 detects a change of the reset signal /RST from "H" to "L" and outputs the pulse signal PLS that goes "H" for the specified period of time tDPL. Consequently, the erase circuit can discharge the boosted voltage VPP by taking the specified time tDPL and resume the standby state irrespectively of the pulse width of the reset signal /RST if it is supplied during the erase operation. It is possible to reliably decrease chances of causing dynamic latch-up or damaging transistors.

Third Embodiment

Figure 5:
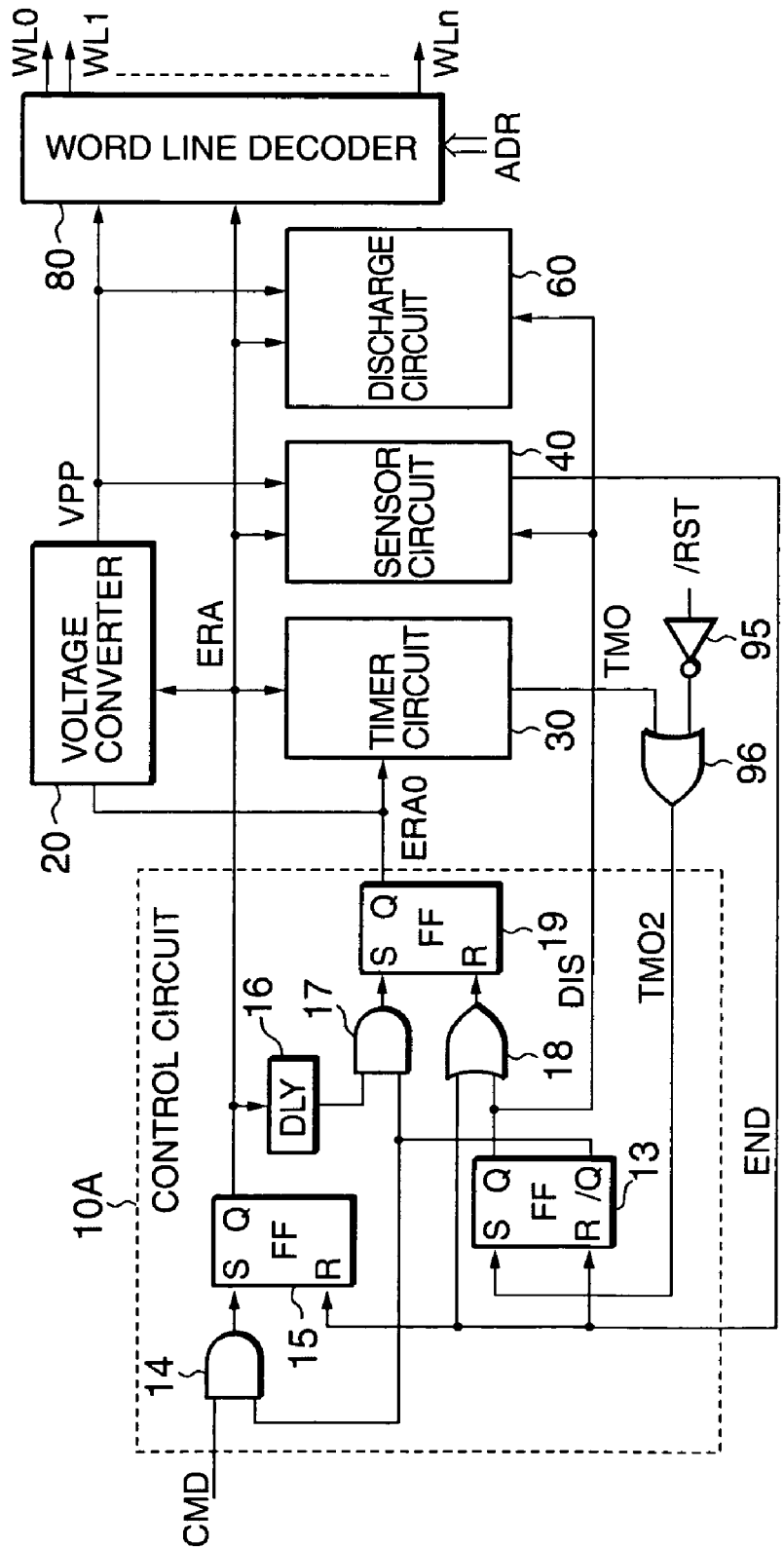
FIG. 5 is a block diagram showing an erase circuit in a flash memory according to a third embodiment of the present invention.

FIG. 5 is a block diagram showing an erase circuit in a flash memory according to a third embodiment of the present invention. The mutually corresponding components in FIGS. 5 and 1 are designated by the same reference numerals and symbols.

This erase circuit is provided with a control circuit 10A, an inverter 95, and an OR 96 having configurations slightly different from those of the control circuit 10, the inverter 91, and ORs 92 and 93 of the erase circuit in FIG. 1.

When supplied with the erase command CMD, the control circuit 10A and the like sequentially output the erase start signal ERA and the erase execution signal ERA0 at a specified time interval. When supplied with the erase termination signal TMO or the reset signal /RST, the control circuit 10A and the like stop the erase execution signal ERA0 and output the discharge control signal DIS. When supplied with the discharge termination signal END, the control circuit 10A and the like stop the erase start signal ERA, the erase execution signal ERA0, and the discharge control signal DIS.

For example, the control circuit 10A has a set/reset type FF 13. An erase termination signal TMO2 is supplied to its set terminal S. The discharge termination signal END is supplied to its reset terminal R. The erase termination signal TMO2 results from OR'ing the reset signal /RST inverted by the inverter 95 with the erase termination signal TMO in the OR 96.

The control circuit 10A has an AND 14 that performs logical multiplication between the erase command CMD and an inverted output signal from the FF 13. The result of the logical multiplication is applied to a set terminal S of an FF 15. The discharge termination signal END is applied to a reset terminal R of the FF 15. An output terminal Q thereof outputs the erase start signal ERA. The output terminal Q of the FF 15 is further connected to one of input sides of an AND 17 via a delay element 16. The other input side of the AND 17 connects with the inverted output terminal /Q from the FF 13.

The output terminal Q of the FF 13 outputs the discharge control signal DIS. The output terminal Q is connected to one of input sides of an OR 18. The other input side of the OR 18 is supplied with the discharge termination signal END. Output sides of the AND 17 and the OR 18 are connected to a set terminal S and a reset terminal R of an FF 19, respectively.

The erase execution signal ERA0 is output from the output terminal Q of the FF 19 and is supplied to the voltage converter 20 and the timer circuit 30. The erase start signal ERA is supplied to the voltage converter 20, the timer circuit 30, the sensor circuit 40, the discharge circuit 60, and the word line decoder 80. The discharge control signal DIS is supplied to the sensor circuit 40 and the discharge circuit 60. The other configurations are the same as those in FIG. 1.

Figure 6:
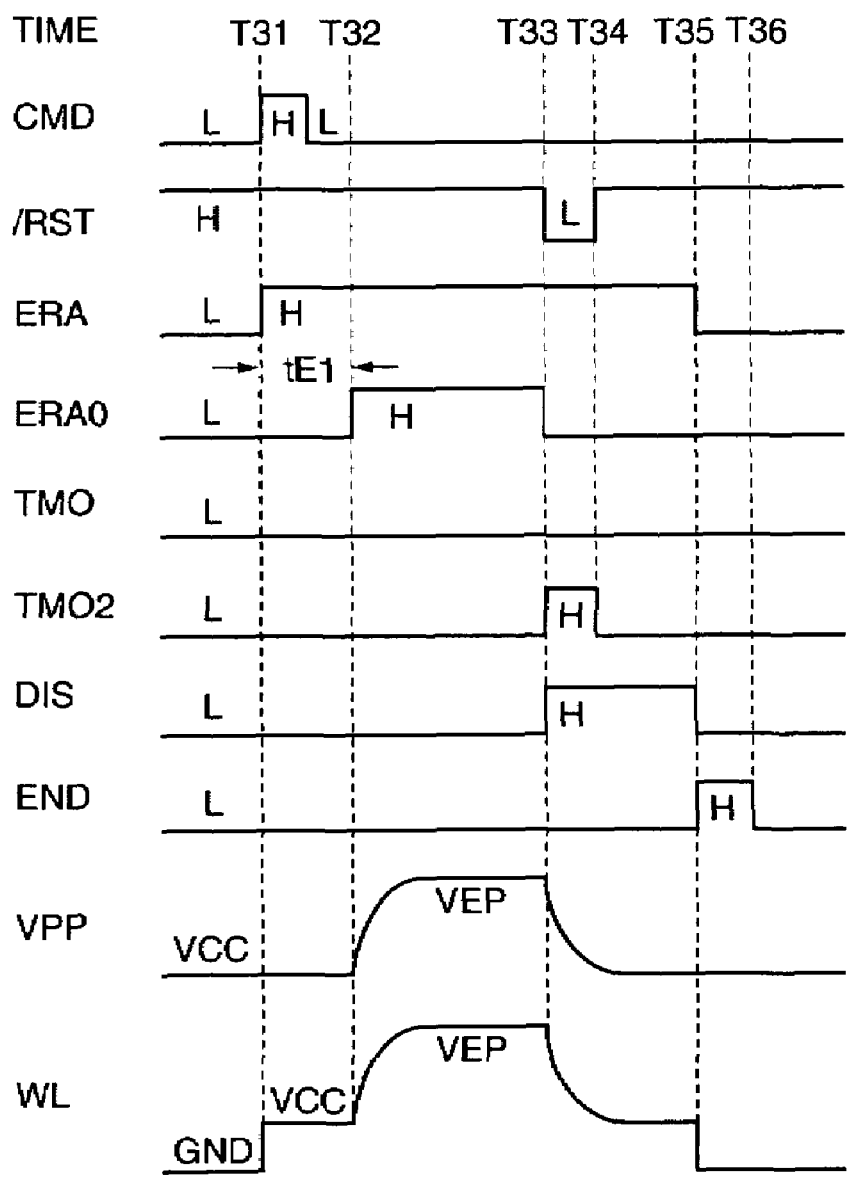
FIG. 6 is a signal waveform diagram showing operations in FIG. 5.

FIG. 6 is a signal waveform diagram showing a reset operation during the erase operation in FIG. 5. With reference to FIG. 6, the following describes operations when the reset is activated during the erase operation of the erase circuit in FIG. 5. Since the normal erase operation is the same as for the first embodiment, the description is omitted.

In the standby state, the reset signal /RST and the erase command CMD remain "H" and "L", respectively. The erase start signal ERA, the erase execution signal ERA0, and the discharge control signal DIS output from the control circuit 10A are all reset to "L". Therefore, the erase termination signal TMO output from the timer circuit 30 and the discharge termination signal END output from the sensor circuit 40 are reset to "L". All word lines WLs of the word line decoder 80 are set to the ground potential GND. The boosted voltage VPP output from the voltage converter 20 is equivalent to the power supply voltage VCC.

When the erase operation starts and the erase command CMD temporarily goes "H" at time T31, the erase start signal ERA goes "H". This releases the standby state of each circuit and starts the erase operation. The word line decoder 80 outputs the power supply voltage VCC to a word line WL selected by the address signal ADR.

When a specified period of time tEI elapses from time T31, the erase execution signal ERA0 goes "H" at time T32. This starts the voltage converter 20 to operate. The boosted voltage VPP rises from the power supply voltage VCC to an erase voltage VEP with the lapse of time. Accordingly, the voltage of the selected word line WL rises from the power supply voltage VCC to the erase voltage VEP with the lapse of time. On the other hand, the timer circuit 30 starts the time monitoring.

When the reset signal /RST goes "L" during the erase operation at time T33, the erase execution signal ERA0 output from the control circuit 10A goes "L". Instead, the discharge control signal DIS goes "H". As a result, the voltage converter 20 and the timer circuit 30 stop. The sensor circuit 40 and the discharge circuit 60 start.

If the reset signal /RST returns to "H" at time T34, the state of the control circuit 10A remains unchanged.

At time T35, the discharging is completed and the discharge termination signal END output from the sensor circuit 40 goes "H". At this time, the erase start signal ERA output from the control circuit 10A goes "L". As a result, all the circuits including the control circuit 10A return to the standby state.

As mentioned above, the erase circuit according to the third embodiment uses the control circuit 10A. When supplied with the reset signal /RST or the erase termination signal TMO, the control circuit 10A stops the erase execution signal ERA0 and outputs the discharge control signal DIS. Even if the reset signal /RST is supplied during the erase operation, the erase circuit performs the same process as that when the erase operation terminates. The same effects as for the second embodiment can be obtained by means of a simpler circuit configuration than the erase circuit according to the second embodiment.

The present invention is not limited to the above-mentioned embodiments, and may be embodied in various modifications as follows.

(a) The circuit configurations of the control circuits 10 and 10A, the timer circuit 20, the sensor circuit 30, and the discharge circuit 60 are not limited to those shown in FIGS. 1 and 5. Any circuit configuration is applicable if it provides equivalent functions.

(b) While there has been described the erase circuit, the present invention is also applicable to a write circuit that uses high voltage.

(c) In accordance with the erase command CMD, the control circuits 10 and 10A first output the erase start signal ERA to make the voltage converter 20 and the like operable. After the specified time, the control circuits 10 and 10A follow the erase execution signal ERA0 to start the voltage converter 20 and the timer circuit 30. To shorten the startup time, the voltage converter 20 and the like may be always active. In this case, however, the erase start signal ERA need not be used as the control signal.

According to the first embodiment, the discharge circuit is configured to discharge high voltage from the voltage converter not only when the discharge control signal is supplied from the control circuit, but also when the reset signal is supplied. Accordingly, the discharge circuit discharges high voltage even if the reset signal is supplied during a rewrite operation to return the control circuit to the standby state. It is possible to suppress occurrence of dynamic latch-up due to the reset condition during a rewrite operation and to prevent transistors and the like from being damaged.

According to the second embodiment, there is provided the pulse circuit that outputs a pulse signal having a specified pulse width when the reset signal is supplied. The discharge circuit is configured to discharge high voltage of the voltage converter not only when a discharge control signal is supplied from the control circuit, but also when the pulse signal is supplied. It is possible to more reliably suppress occurrence of dynamic latch-up due to the reset condition during a rewrite operation and to prevent transistors and the like from being damaged.

According to the third embodiment, the control circuit is configured as follows. When the reset signal or a rewrite completion signal is supplied, the control circuit stops a rewrite execution signal. In addition, the control circuit outputs the discharge control signal that instructs high voltage to be discharged. The same effects as for the second embodiment can be obtained by means of the simpler circuit configuration than the second embodiment.

What is claimed is:
1. A nonvolatile memory device comprising:
   a memory cell array having a plurality of nonvolatile memory cells capable of erasing data by applying high voltage;
   a control circuit generating an erase execution signal in response to an erase command signal received thereto, the control circuit stopping the erase execution signal and generating a discharge control signal in response to an erase termination signal received thereto, the control circuit stopping the discharge control signal in response to a discharge termination signal received thereto, the control circuit stopping the erase execution signal and the discharge control signal in response to a reset signal received thereto;

a voltage boost circuit providing high voltage to the memory cell for erasing data in response to the erase execution signal;

a timer circuit generating the erase termination signal when a predetermined time elapses after receiving the erase execution signal;

a discharge circuit discharging the high voltage supplied from the voltage boost circuit in response to either one of the discharge control signal and the reset signal received thereto; and a sensor circuit being enabled in response to either one of the discharge control signal and the reset signal received thereto, the sensor circuit generating the discharge termination signal when the high voltage drops down to a predetermined voltage.

2. A nonvolatile memory device according to claim 1, further comprising a word line decoder for providing the high voltage to the memory cell array.

3. A nonvolatile memory device according to claim 1, wherein the control circuit includes a plurality of flip-flops and a plurality of gate circuits.

4. A nonvolatile memory device according to claim 1, wherein the timer circuit includes an oscillator for generating a clock signal and a counter for counting the clock signal in response to the erase execution signal.

5. A nonvolatile memory device according to claim 1, wherein the control circuit further generating an erase starting signal in response to the reset signal and the erase command signal.

6. A nonvolatile memory device according to claim 5, wherein the wherein the timer circuit includes an oscillator for generating a clock signal in response to the erase starting signal and a counter for counting the clock signal in response to the erase execution signal.

7. A nonvolatile memory device comprising: a memory cell array having a plurality of nonvolatile memory cells capable of erasing data by applying high voltage;

a control circuit generating an erase execution signal in response to an erase command signal received thereto, the control circuit stopping the erase execution signal and generating a discharge control signal in response to an erase termination signal received thereto, the control circuit stopping the discharge control signal in response to a discharge termination signal received thereto, the control circuit stopping the erase execution signal and the discharge control signal in response to a reset signal received thereto;

a pulse circuit generating a pulse signal having a predetermined pulse width in response to the reset signal;

a voltage boost circuit providing high voltage to the memory cell for erasing data in response to the erase execution signal;

a timer circuit generating the erase termination signal when a predetermined time elapses after receiving the erase execution signal;

a discharge circuit discharging the high voltage supplied from the voltage boost circuit in response to either one of the discharge control signal and the reset signal received thereto; and a sensor circuit being enabled in response to either one of the discharge control signal and the pulse signal received thereto, the sensor circuit generating the discharge termination signal when the high voltage drops down to a predetermined voltage.

8. A nonvolatile memory device according to claim 7, further comprising a word line decoder for providing the high voltage to the memory cell array.

9. A nonvolatile memory device according to claim 7, wherein the control circuit includes a plurality of flip-flops and a plurality of gate circuits.

10. A nonvolatile memory device according to claim 7, wherein the timer circuit includes an oscillator for generating a clock signal and a counter for counting the clock signal in response to the erase execution signal.

11. A nonvolatile memory device according to claim 7, wherein the control circuit further generating an erase starting signal in response to the reset signal and the erase command signal.

12. A nonvolatile memory device according to claim 11, wherein the wherein the timer circuit includes an oscillator for generating a clock signal in response to the erase starting signal and a counter for counting the clock signal in response to the erase execution signal.

13. A nonvolatile memory device comprising:
a memory cell array having a plurality of nonvolatile memory cells capable of erasing data by applying high voltage;

a control circuit generating an erase execution signal in response to an erase command signal received thereto, the control circuit stopping the erase execution signal and generating a discharge control signal in response to either one of a reset signal and an erase termination signal received thereto, the control circuit stopping the erase execution signal and the discharge control signal in response to a discharge termination signal received thereto;

a voltage boost circuit providing high voltage to the memory cell for erasing data in response to the erase execution signal;

a timer circuit generating the erase termination signal when a predetermined time elapses after receiving the erase execution signal;

a discharge circuit discharging the high voltage supplied from the voltage boost circuit in response to the discharge control signal received thereto; and a sensor circuit being enabled in response to the discharge control signal received thereto, the sensor circuit generating the discharge termination signal when the high voltage drops down to a predetermined voltage.

14. A nonvolatile memory device according to claim 13, further comprising a word line decoder for providing the high voltage to the memory cell array.

15. A nonvolatile memory device according to claim 13, wherein the control circuit includes a plurality of flip-flops and a plurality of gate circuits.

16. A nonvolatile memory device according to claim 13, wherein the timer circuit includes an oscillator for generating a clock signal and a counter for counting the clock signal in response to the erase execution signal.

17. A nonvolatile memory device according to claim 13, wherein the control circuit further generating an erase starting signal in response to the reset signal and the erase command signal.

18. A nonvolatile memory device according to claim 17, wherein the wherein the timer circuit includes an oscillator for generating a clock signal in response to the erase starting signal and a counter for counting the clock signal in response to the erase execution signal.

* * * * *